(12) United States Patent
Troia et al.

(10) Patent No.: US 11,749,325 B2
(45) Date of Patent: *Sep. 5, 2023

(54) MEMORY DEVICE HAVING AN ENHANCED ESD PROTECTION AND A SECURE ACCESS FROM A TESTING MACHINE

(71) Applicant: Micron Technology, Inc., Boise, ID (US)

(72) Inventors: Alberto Troia, Munich (DE); Antonino Mondello, Messina (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/891,697

(22) Filed: Aug. 19, 2022

(65) Prior Publication Data

US 2022/0399047 A1 Dec. 15, 2022

Related U.S. Application Data

(63) Continuation of application No. 16/625,080, filed as application No. PCT/IB2019/000486 on May 31, 2019, now Pat. No. 11,423,964.

(51) Int. Cl.
*G11C 7/24* (2006.01)
*G01R 31/3177* (2006.01)
(Continued)

(52) U.S. Cl.
CPC .......... *G11C 7/24* (2013.01); *G01R 31/3177* (2013.01); *G11C 29/50004* (2013.01);
(Continued)

(58) Field of Classification Search
CPC .. H01L 2224/49175; G11C 2029/5004; G11C 29/50004; G11C 7/24; G11C 29/12;
(Continued)

(56) References Cited

U.S. PATENT DOCUMENTS

| 7,590,902 B1 | 9/2009 | Tabatabaei et al. |
| 11,423,964 B2 * | 8/2022 | Troia ................. G01R 31/3177 |

(Continued)

OTHER PUBLICATIONS

International Search Report and Written Opinion from related international application No. PCT/IB2019/000486, dated Feb. 14, 2020, 12 pages.

*Primary Examiner* — April Y Blair
*Assistant Examiner* — Sazzad Hossain
(74) *Attorney, Agent, or Firm* — Brooks, Cameron & Huebsch, PLLC

(57) ABSTRACT

The present disclosure relates to a memory device comprising:
an array of memory cells;
a plurality of boundary cells able to manage serial and parallel data;
mixed pads connected to the memory cells through low speed paths, the mixed pads being configured to be contacted by probes of a testing machine;
high speed pads connected to the boundary cells through high speed paths;
a three state multiplexer block connected to the memory cells and to the boundary cells and configured to receive thereto at least a first input signal and a second input signal, the three state multiplexer block being also connected to the mixed pads;
ESD networks connected to the mixed pads;
an enabling circuit connected to one of the mixed pads, configured to receive an external enabling signal and to provide the three state MUX with an internal enabling signal;
wherein the enabling circuit comprises:
a tester presence detector circuit connected to the mixed pad; and
(Continued)

a logical gate having respective input terminals connected to the tester presence detector circuit and configured to receive the external enabling signal, and an output terminal configured to provide the internal enabling signal, the tester presence detector circuit configured to provide a presence signal to the logical gate when a testing machine is connected to the mixed pad.

The disclosure also relates to a System-on-Chip (SoC) component comprising a memory device, namely as embedded device as well as to a method implementing an enhanced ESD protection and a secure access to memory cells.

20 Claims, 4 Drawing Sheets

(51) Int. Cl.
*G11C 29/50* (2006.01)
*G11C 7/10* (2006.01)
*G11C 29/12* (2006.01)
*G01R 31/3185* (2006.01)

(52) U.S. Cl.
CPC .... *G01R 31/318572* (2013.01); *G11C 7/1057* (2013.01); *G11C 7/1084* (2013.01); *G11C 29/12* (2013.01); *G11C 2029/5004* (2013.01); *H01L 2224/49175* (2013.01)

(58) Field of Classification Search
CPC ............... G11C 7/1057; G11C 7/1084; G01R 31/3177; G01R 31/318572
See application file for complete search history.

(56) References Cited

U.S. PATENT DOCUMENTS

| | | |
|---|---|---|
| 2002/0126430 A1 | 9/2002 | Roohparvar |
| 2003/0042941 A1* | 3/2003 | Wang ............... H03K 19/17744 327/108 |
| 2009/0085599 A1* | 4/2009 | Choi .................. G01R 31/2884 324/754.06 |
| 2010/0237877 A1 | 9/2010 | Hsu |
| 2016/0216319 A1* | 7/2016 | Na ..................... G11C 29/1201 |
| 2017/0068593 A1 | 3/2017 | Yohsinaga et al. |
| 2018/0130739 A1 | 5/2018 | Miura et al. |

* cited by examiner

MEMORY DEVICE HAVING AN ENHANCED ESD PROTECTION AND A SECURE ACCESS FROM A TESTING MACHINE

PRIORITY INFORMATION

This application is a Continuation of U.S. application Ser. No. 16/625,080, filed on Dec. 20, 2019, which is a National Stage Application under 35 U.S.C. § 371 of International Application Number PCT/IB2019/000486, filed on May 31, 2019, the contents of which are incorporated herein by reference.

TECHNICAL FIELD

The present invention relates to memory devices and in particular to a memory device having an enhanced ESD protection and a secure access from a testing machine

BACKGROUND

Electrostatic discharge (ESD) protection is a critical issue when managing memory devices, more so due to the recent developments of the memory designs, the ESD tied problems being intensified by shrinking transistor dimensions and oxide layer thicknesses.

ESD protection checks are however consuming vastly more runtime and memory area due to the growing die sizes of system-on-chips (SoCs) and to the number of transistors they can hold, each one needing an ESD protection structure.

A system on a chip or SoC is a semiconductor integrated circuit that integrates all components of a computer or other electronic systems. These components typically include a central processing unit (CPU), memory portions, input/output ports and secondary storage components, all on a single semiconductor substrate.

Particularly in the automotive field there is a felt need to dispose of SoC devices including controllers, memories and connections with many external sensors and actuators.

Basically, the ESD protection is realized by providing alternative paths for ESD derived currents, namely through unpowered devices, usually indicated as ESD network.

An ESD network is usually provided when ESD could occur. Namely, an ESD network is connected to each external or testing pad, where contact probes of an external testing machine abut, the testing processes dealing with high ESD.

It is desirable to solve the ESD tied problems, providing the memory device with an efficient and secure ESD protection, namely connecting an ESD network to testing pads able to connect the memory device with an external testing machine and allowing the communication with the memory cells only when such a testing machine is actually connected to the testing pads, also dealing with different privilege levels and different testing modes.

DETAILED DESCRIPTION

Figure 1:
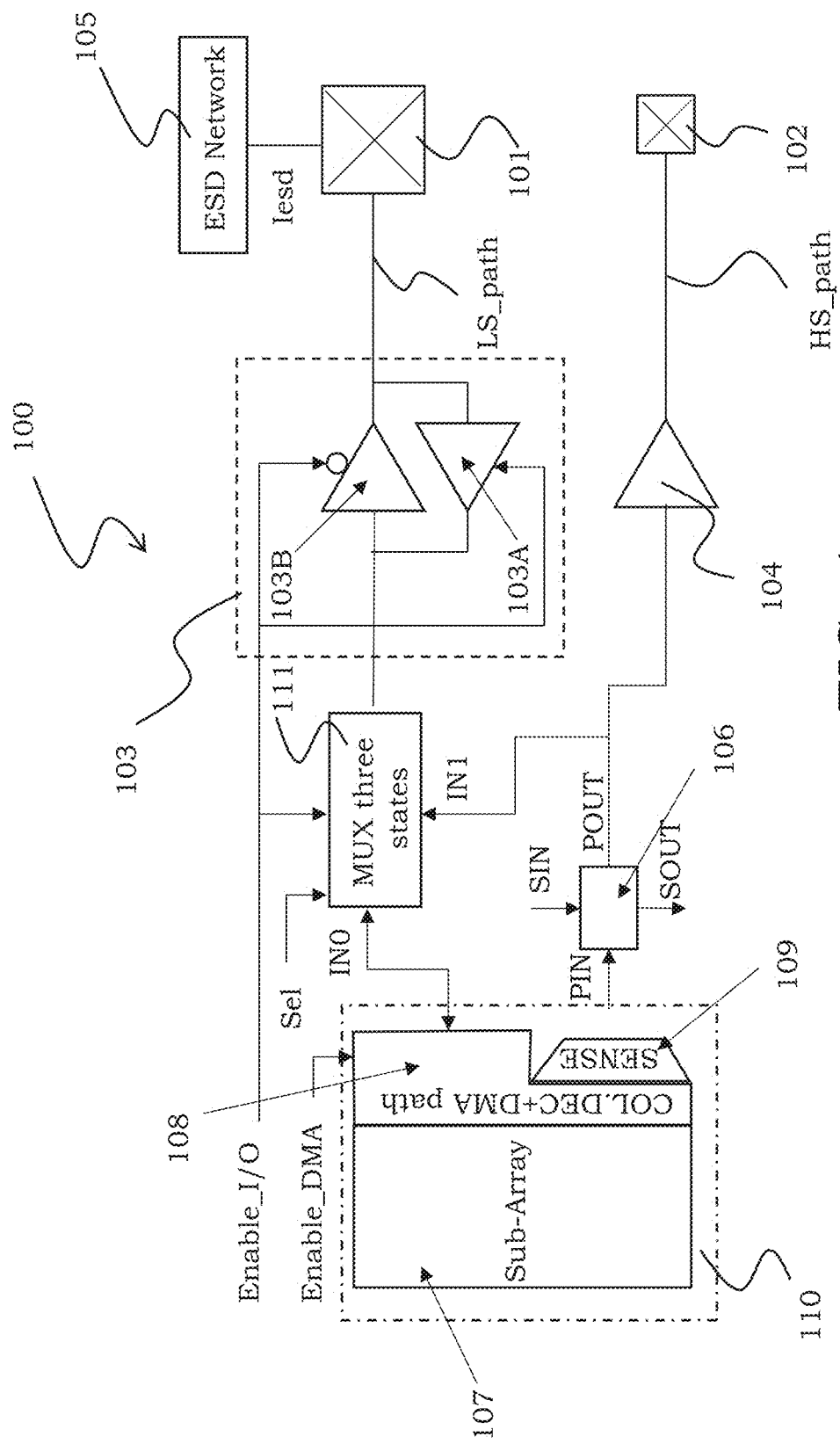
FIG. 1 shows a block diagram of a memory device provided with an ESD protection for mixed pads.

With reference to those figures, a memory device provided with an enhanced ESD protection, pad contact detection and secure access will be disclosed herein.

More particularly, as it will be described into details in the following, the proposed a memory device provided with an enhanced ESD protection, pad contact detection and secure access is aimed to correctly protect mixed pads for testing purposes, the mixed pads being able to connect to a testing machine or a host device along a low speed path and, alternatively, also to a high speed path so as to allow different test modes to be realized only to authorized accesses.

An example memory device includes:
an array of memory cells;
a plurality of boundary cells able to manage serial and parallel data;
mixed pads connected to the memory cells through low speed paths, the mixed pads being configured to be contacted by probes of a testing machine;
high speed pads connected to the boundary cells through high speed paths;
a three state multiplexer block connected to the memory cells and to the boundary cells and configured to receive thereto a first input signal and a second input signal, the three state multiplexer block being also connected to the mixed pads;
ESD networks connected to the mixed pads;
an enabling circuit connected to one of the mixed pads, configured to receive an external enabling signal and to provide the three state MUX with an internal enabling signal;
wherein the enabling circuit comprises:
a tester presence detector circuit connected to the mixed pad; and
a logical gate having respective input terminals connected to the tester presence detector circuit and configured to receive the external enabling signal, and an output terminal configured to provide the internal enabling signal,
the tester presence detector circuit configured to provide a presence signal to the logical gate when a testing machine is connected to the mixed pad. In the context of this disclosure, low speed and high speed have and a respective valence (e.g., a low speed is relatively lower than a high speed that in turn is relatively higher than a low speed). Just as an example without any limitation, a low speed path or a low speed pad may be suitable for operation at 133 MHz and high speed path or a high speed pad may be suitable for operation of 1 GHz or more.

In an embodiment, the enabling circuit may further comprise a pull up circuit connected to the mixed pad and to the tester presence detector circuit.

Moreover, the tester presence detector circuit may further comprise a sequence detection circuit configured to detect a bit sequence applied to the mixed pad to verify that testing machine is an authorized one or that the testing mode is the correct one and grant a corresponding access to the memory cells from the mixed pad.

Furthermore, the memory array may receive a specific enabling signal in order to allow a direct access to the memory cells by connecting directly the memory cells to the three state MUX and thus to the mixed pad.

The present disclosure also relates to a System-on-Chip (SoC) component comprising a memory device, in particular as embedded device.

The disclosure further relates to a method implementing an enhanced ESD protection and a secure access to memory cells comprising the steps of:

detecting the connection of a testing machine to a mixed pad of an ESD protected memory device comprising an array of memory cells, the mixed pad being connected to an ESD Network;

enabling the generation of an internal enabling signal for a three state MUX which provides the mixed pad with an input signal from the memory cells;

performing a testing of the mixed pad.

More particularly, the method may comprise a selection step of the input signal from the memory cells by means of a selection signal received by the three state MUX.

The method may further comprise a step of connecting memory cells of a memory array to the mixed pad by means of a high voltage buffer along a low speed path when a first input signal is selected by the three state MUX or a step of connecting boundary cells to the mixed pad by means of a buffer along a high speed path when a second input signal is selected by the three state MUX.

The detecting step may further comprises detecting a bit sequence applied to the mixed pad to verify that testing machine is an authorized one or that the testing mode is the correct one and grant a corresponding access to the memory cells from the mixed pad.

A step of storing bit sequences of the mixed pads and a step of updating the stored bit sequences at the end of each testing operation may also be provided.

Memory devices having a very high parallelism, for instance memory chip in SoCs or in other staked configurations, are provided with a huge number of pads. The majority of these pads are used for internal communications and thus do not require any ESD protection arrangement; these pads are connected to a memory array through high speed paths and thus they are usually indicated as high speed pads or HS pads. HS pads are usually not capable to manage analog voltages and have really reduced sizes.

Memory devices are also provided with so called testing pads being used to contact an external testing machine. The testing pads are usually bigger in size than the HS pads. The testing pads can be Input, Output or Input/Output pads and are connected to the memory array through low speed paths by means of suitable buffers. Moreover, respective ESD networks are connected to the testing pads which are subjected to ESDs, mainly due to the connection with the testing machine indeed.

FIG. 1 is a block diagram of an example memory device 100 provided with an ESD protection.

ESD protected memory device 100 comprises mixed pads 101 for testing purposes, along with high speed pads 102 for internal communications, as above indicated. As will be clarified below, each mixed pad 101 is to be connected to an external testing machine and is able to connect to a memory block 110 along a low speed path LS_path and, alternatively, also to along a high speed path HS_path so as to allow different test modes to be performed by means of such mixed pads 101. Being able to connect to a testing machine, the mixed pads 101 can be able to drive very high capacitive loads and have size being sufficient to allow standard contact probes of the testing machine to land thereon.

As shown in FIG. 1, a mixed pad 101 is connected, along the low speed path LS_path, to a memory array 110, by means of a High Voltage or HV buffer 103, in turn comprising respective elementary buffers 103A, 103B in an inverter configuration. HV buffer 103 may also be provided with high voltage switches so as to manage also high voltages. Elementary buffers 103A, 103B are driven by a first enabling signal Enable_I/O, directly or an inverted manner, respectively. The first enabling signal Enable_I/O enables the I/O data transfer for the mixed pad 101.

Mixed pad 101 is also coupled to an ESD Network 105 able to deviate a ESD-related current Iesd toward inactive elements comprised therein.

A high speed pad 102 is connected, along the high speed path HS_path, toward the memory block 110 by means of a further buffer 104 having low driving capability. It is remarked that buffer 104 has reduced sizes with respect in particular to HV buffer 103 and the provision of such buffer 104 for each high speed pad 102, being in high number, does not negatively impact on the size of the ESD protected memory device 100 as a whole. Moreover, no ESD protection is needed for these high speed pads 102, hence no ESD networks is provided for the same in some embodiments.

More particularly, high speed pad 102 is connected to a boundary cell 106 coupled to the memory block 110. Boundary cell 106 is able to manage serial Input and Output data, SIN and SOUT, and parallel Input and Output data, PIN and POUT, respectively, the latter being connected to the high speed pad 102 through the buffer 104.

Memory block 110 comprises a sub-array 107 of memory cells connected to a decoding block 108, in turn comprising a column decoder as well as a DMA (Direct Memory Access) path, and connected to sense amplifiers 109.

ESD protected memory device 100 further comprises a three state multiplexer block or MUX 111, in turn connected to the memory block 110 and to the boundary cell 106. Three state MUX 111 is provided with the first enabling signal Enable_I/O enabling the I/O data transfer as well as with a selection signal Se1. Three state MUX 111 further receive a first input signal IN0 from memory block 110 and a second input signal IN1 from the boundary cell 106. More particularly, the selection signal Se1 controls the three state MUX 111 in order to select between the input signals to be provided to the HV buffer 103 and thus to the mixed pad 101.

According to an alternative embodiment, the three state MUX 111 may receive more than two input signals and provide one of a plurality of input signals to the HV buffer 103 on the basis of the selection signal Se1. This could be the case of memory devices having more than two paths to be connected with the mixed pad 101, in particular thought the elementary buffer 103A of the HV buffer 103.

DMA usually allows an hardware subsystem to access a main system memory (random-access memory), independent of a central processing unit (CPU). This feature is particularly useful when the CPU cannot keep up with the rate of data transfer, or when the CPU needs to perform work while waiting for a relatively slow I/O data transfer.

Being a direct access to the memory sub-array 107, the DMA path should be carefully controlled. A specific enabling signal Enable_DMA is provided to the decoding block 108 in order to enable DMA, i.e. direct access to the memory sub-array 107. In particular, when DMA is enabled, the memory sub-array 107 is directly connected to the three state MUX 111 and provides thereto the first input signal IN0. It should be remarked that, according to the DMA mode, the memory sub-array 7 is connected with the three state MUX 111 through the DMA path included in the decoding block 108, which also comprises a standard column decoder used to connect the sense amplifiers 109 to the memory sub-array 107. Otherwise, the first input signal IN0 is provided by the column decoders comprised in the decoding block 108.

Figure 2:
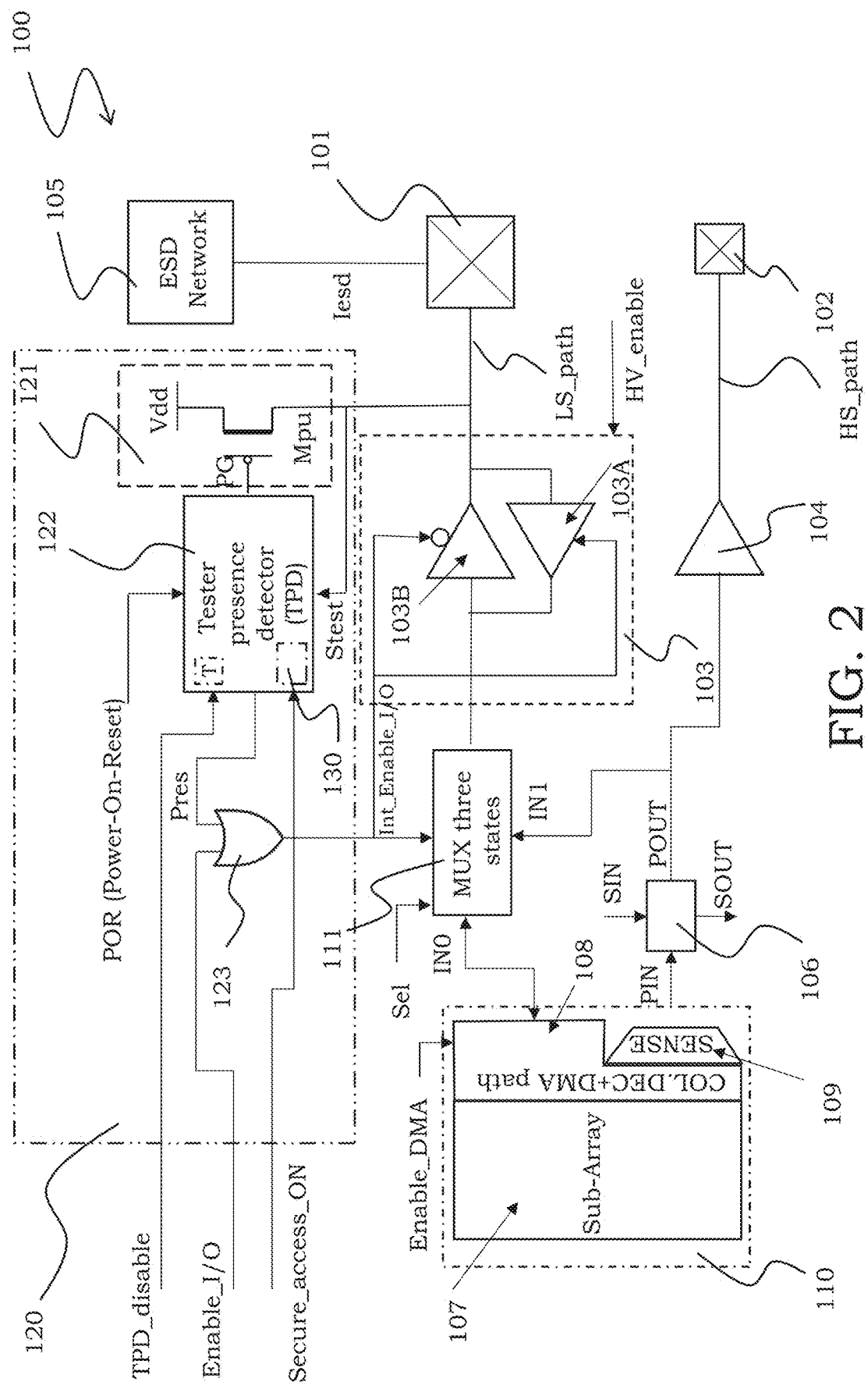
FIG. 2 shows a block diagram of a memory device provided with an enhanced ESD protection and secure access in accordance with an embodiment of the present disclosure.

According to an embodiment of the present disclosure as shown in FIG. 2, ESD protected memory device 100 is provided with an arrangement to check the connection of the mixed pad with a testing machine as well as the true nature of such a connection, as will be explained in the following.

ESD protected memory device 100 comprises an enabling circuit 120 having an enhanced ESD protection, pad contact detection and secure access, connected to the mixed pad 101, receiving the first enabling signal Enable_I/O and providing the three state MUX 111 and the HV buffer 103 with a fourth enabling signal Int_Enable_I/O.

In particular, enabling circuit 120 comprises a pull up circuit 121 connected to the mixed pad 101 and to a tester presence detector or TPD circuit 122. More particularly, pull up circuit 121 comprises a pull up open gate transistor Mpu inserted between a power voltage reference Vdd and the mixed pad 101 and having a gate terminal connected to the TPD circuit 122 and receiving therefrom a control signal PG. As will be clarified in the following description, the control signal PG is able to disconnect or switch off the pull up open gate transistor Mpu, TPD circuit 122 is in turn connected to the mixed pad 101 and receives therefrom a test signal Stest. TPD circuit 121 further receives a powering signal POR (Power-On-Reset) and a disabling signal TPD_disable. Such powering and disabling signals are provided to the ESD protected memory device 100 from a suitable external control circuit. As will be clarified in the following, the test signal Stest indicates that a testing machine is connected to the mixed pad 101 and is able to detect such a testing machine.

Moreover, the first enabling signal Enable_I/O, the DMA enabling signal Enable_DMA and the selection signal Se1 can be managed via JTAG by setting some internal register.

Enabling circuit 120 also comprises a logical gate 123, namely a NOR gate, having respective input terminals, receiving a presence signal Pres from the TPD circuit 122 and the first enabling signal Enable_I/O, and an output terminal providing the fourth enabling signal Int_Enable_I/O.

According to a further embodiment not shown in the figures, the fourth enabling signal Int_Enable_I/O may be used as selection signal Se1. Alternatively, a test register T-reg may also be used as selection signal Se1 in some embodiments.

Normally, the voltage value at the mixed pad 101 is maintained high due to the pull up open gate transistor Mpu connected thereto. In particular, after the ESD protected memory device 100 power-up (powering signal POR being pulsed), the TPD circuit 122 enables the pull up open gate transistor Mpu and maintain it active up to the follow events.

When a contact probe of a testing machine lands on the mixed pad 101, according to a prefixed protocol, a voltage value of 0V is provided to the pull up open gate transistor Mpu. It should be remarked that the contact between the mixed pad 101 and the testing machine is secured from the ESD tied problems thanks to the ESD Network 105 connected to the mixed pad 101.

After the provision of a 0V voltage value, the pull up open gate transistor Mpu starts to pull a current from the mixed pad 101, being however compensated by the stronger testing machine. This results into a 0V voltage value for a test signal Stest being provided to the TPD circuit 122, which certifies that a testing machine has been connected to the mixed pad 101 and generates the presence signal Pres for the logical gate 123.

TPD circuit 122 also generates a suitable control signal PG for the gate terminal of the pull up open gate transistor Mpu, which is thus switched off so as to not interfere with the testing of the mixed pad 101. More particularly, the pull up open gate transistor Mpu is switched off up to a next power cycle (powering signal POR being pulsed) or when the signal TPD_disable is pulsed.

Suitably, when the TPD circuit 122 is further switched on by the powering signal POR, the pull up open gate transistor Mpu is newly switched on and duly connected to the mixed pad 101, ready to a further testing operation of the same.

When the I/O data transfer is enabled by the first enabling signal Enable_I/O, the logical gate 123 generates a corresponding fourth enabling signal Int_Enable_I/O for the three state MUX 111 and the HV buffer 103 allowing the first input signal IN0 or the second input signal IN1 to be provided to the mixed pad 101 for testing purposes. In particular, the provision of the first input signal IN0 or of the second input signal IN1 is regulated by the selection signal Se1 applied to the three state MUX 111.

Moreover, according to an alternative embodiment, enabling circuit 120 further comprises a privilege levels mechanism in order to detect not only when a testing machine is connected to the mixed pad 101 but also that such a testing machine is an authorized one or that the testing mode is the correct one.

Figure 3A:
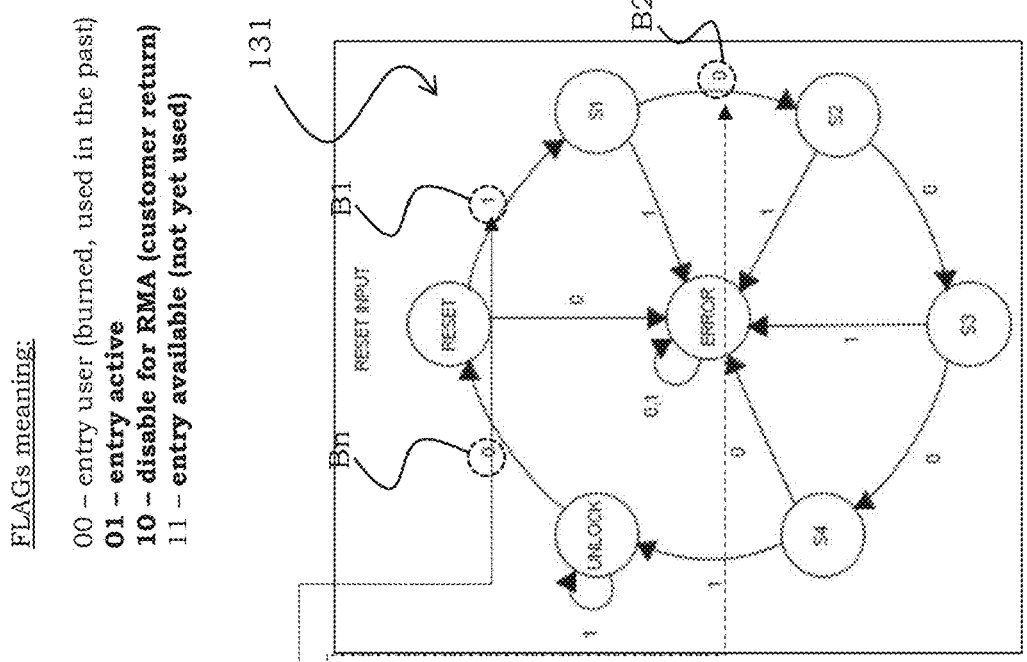
FIGS. 3A and 3B respectively show a finite state machine (FSM) and a related lookup table implementing a decisional sequence for the memory device of FIG. 2 in accordance with an alternative embodiment of the present disclosure.

TPD circuit 122 comprises a sequence detection circuit 130, in turn comprising a finite state machine (FSM) 131, as shown in FIG. 3A. The sequence detection circuit 130 is enabled by writing an internal non volatile flag, Secure_access_ON.

A sequence of bit B1 . . . Bn is stored, the sequence detection circuit 130 enabling the TPD circuit 122 by switching off the pull up open gate transistor Mpu only if a correct sequence is detected. In particular, the finite state machine 131 comprises a plurality of states connected according to the stored sequence of bits so that only the correct bit sequence leads to the unlock state, any other transition between states being indicated as an error.

Figure 3B:
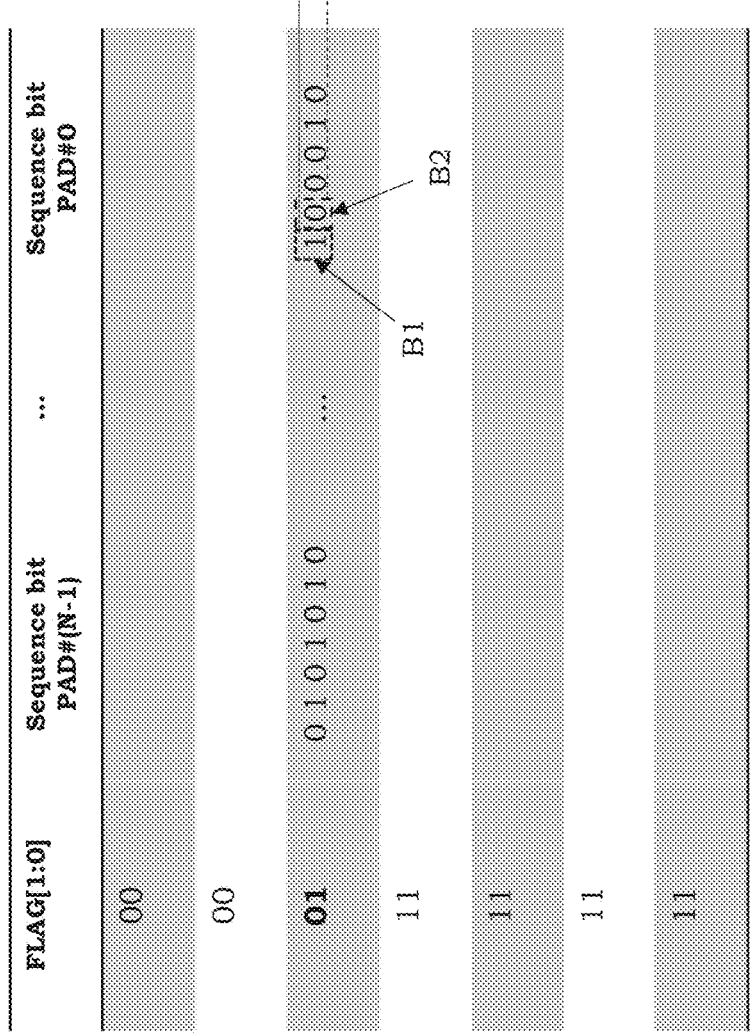

According to this alternative embodiment, bit sequences can be stored for each mixed pad 101 and equal for all ESD protected memory devices (hardware coded). In particular, the bit sequences are stored in a lookup table 132, as shown in FIG. 3B.

TPD circuit 122 also comprises a timer T. When the testing machine is connected to the mixed pad 101, the timer T is also triggered and signals a possible time out, i.e. the elapsing of a time limit, that requires a restart of the testing procedure, in particular by disconnecting and reconnecting the contact probes of the testing machine. Otherwise, the testing procedure is correctly performed if the correct bit sequence is provided within the time limit.

According to a further alternative embodiment, the bit sequences are programmable by the testing machine, for instance stored in dedicated Flash memory cells of the memory sub-array 107, outside the user address space. In this way, the bit sequence may be changed for each memory device or for a bunch of memory devices, for instance all devices being provided to a client.

Moreover, in case of programmable bit sequences, a countermeasure against the called "reply attack" is implemented by providing the update of the stored bit sequences, for example stored in lookup table 132, at the end of each testing operation in some embodiments. In this case, a subsequent access to the ESD protected memory device 100 for testing purposes could not be made using a same bit sequence. This feature is particularly useful when a testing mode is available for the final client and not only at the factory level.

At power-up, each lookup table 132 is preloaded with the PAD # sequence to be recognized.

According to the example embodiment of FIGS. 3A and 3B, a current bit sequence used is the one with the flag 0b01. New bit sequences for the mixed pada are then written in the next available entry (11), then the current flag is burned (i.e., flag bit 01 substitutes flag bit 00).

In case of a customer return, the available entry is programmed to 0b10 before separating the memory device from the rest of the SoC.

The TPD circuit 122 can be a single TDP being implemented in the memory device and controlling the pull up open gate transistors of all the mixed pads 101. In this case, the TPD circuit 122 receives the bit sequence from just one pad and enables all the mixed pads if the bit sequence is recognized as correct.

Otherwise, the ESD protected memory device 100 can comprise multiple TPD circuits 122, each one being dedicated to a respective mixed pad 101 and controlling the pull up open gate transistor Mpu connected thereto.

In this case, each TPD circuit 122 receives the bit sequence and enables (if the sequence is right) only one mixed pad 101.

Finally, a multiple pad TPD circuit 122 may be used, being a single TPD circuit 122 implemented in the memory device which controls all the pull up open gate transistors of all the mixed pads. In this case, the TPD circuit 122 is able to recognize multiple different sequences (one per mixed pad) in parallel.

The present disclosure also relates to a System-on-Chip or SoC component comprising the ESD protected memory device as an embedded device.

More particularly, the ESD protected memory device may be structurally independent and coupled to the SoC component for instance through a plurality of pillars.

The ESD protected memory device may implement DMA to reduce the final latency that the SoC component can experience when reading the data.

Figure 4:
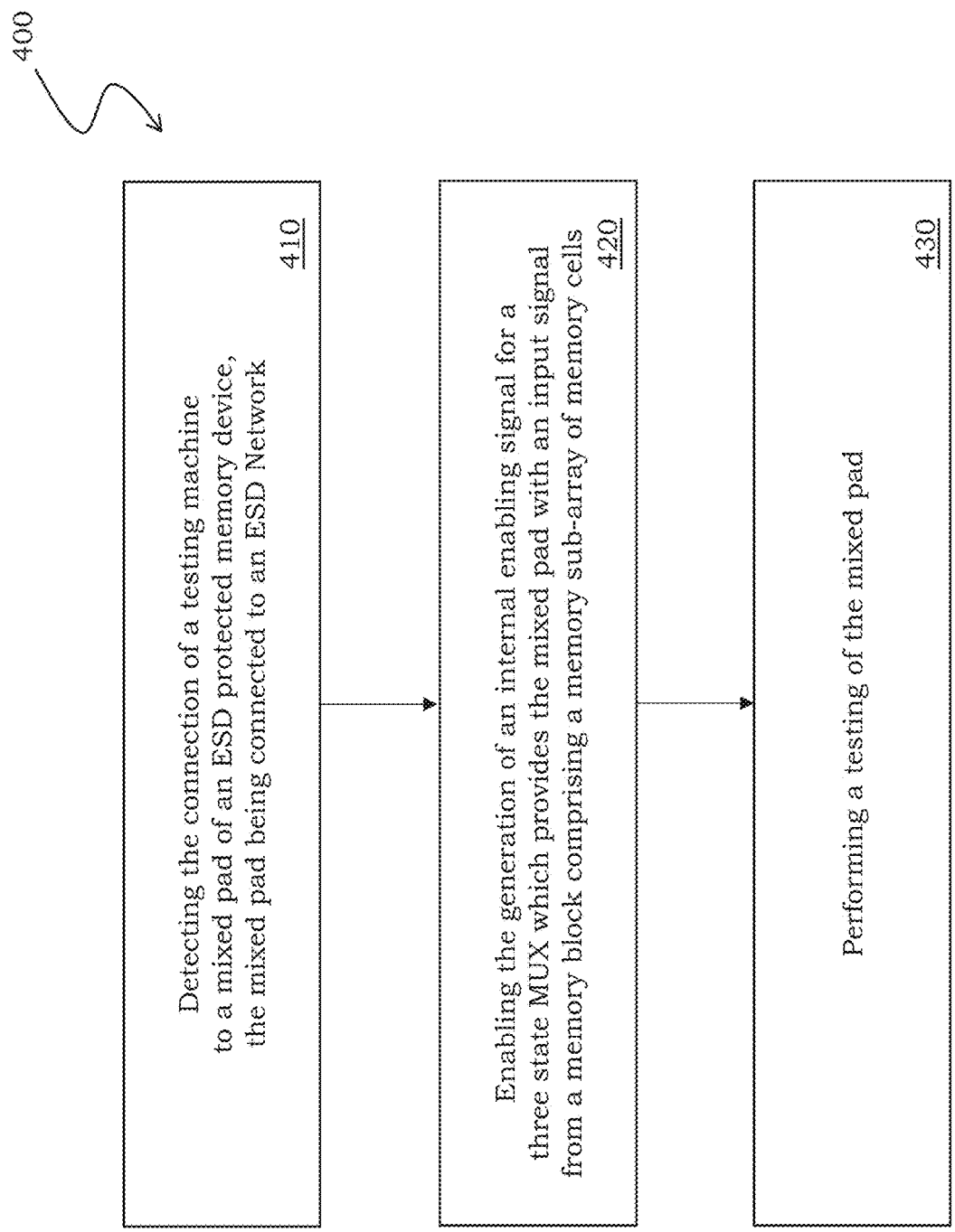
FIG. 4 shows a block diagram of a method implementing an enhanced ESD protection and a secure access to memory cells in accordance with an embodiment of the present disclosure.

According to another embodiment of the present disclosure, a method 400 implementing an enhanced ESD protection and a secure access to memory cells is provided, as depicted in FIG. 4.

The method comprises the following steps of:

(step 410) detecting the connection of a testing machine to a mixed pad 101 of an ESD protected memory device 100, the mixed pad 101 being connected to an ESD Network 105;

(step 420) enabling the generation of an internal enabling signal Int_Enable_I/O for a three state MUX 111 which provides the mixed pad 101 with an input signal IN0, IN1 from a memory block 110 comprising a memory sub-array 107 of memory cells;

(step 430) performing a testing of the mixed pad 101.

More particularly, the method may further comprise a selection step of the input signal IN0, IN1 by means of the three state MUX 111 and a selection signal Sel received by it.

As previously indicated, the selection signal Sel can be the internal enabling signal Int_Enable_I/O or a test register T-reg. Moreover, even if not shown in the figures, more than two input signals may be selected.

Moreover, the method may comprise a step of connecting the memory cells of the memory sub-array 107 of the memory block 110 to the mixed pad 101 by means of a HV buffer 103 along a low speed path LS_path when a first input signal IN0 is selected. In other embodiments, the method may comprise a step of connecting a boundary cell 106 connected to the memory block 110 to the mixed pad 101 by means of a buffer 104 along a high speed path HS_path when a second input signal IN1 is selected.

The detecting step may further comprise driving a pull up open gate transistor Mpu connected to the mixed pad 101 and to a TPD circuit 122 which generates the internal enabling signal Int_Enable_I/O.

The detecting step may further comprise detecting a bit sequence applied to the mixed pad 101 to verify that testing machine is an authorized one or that the testing mode is the correct one and grant a corresponding access to the memory cells from the mixed pad 101.

The method may in this case also comprise a step of storing the bit sequences of the mixed pads 101 as well as a step of updating the stored bit sequences at the end of each testing operation.

Summing up, the present disclosure provides an ESD protected memory device which permits to protect a mixed pad for testing purposes, also allowing data along a high speed path to be provided thereto, the mixed pad being capable to manage HV without affecting the high speed path.

More particularly, by using an ESD protected memory device according to the present disclosure and implementer may actually choose between the following options:

1) using both the enhanced ESD protection and the pad connection detection features.

In this case, the tester presence detector circuit is used to provide a control signal PG having a high value so as to switch off the pull up open gate transistor Mpu, that receives such control signal PG on its gate terminal. Moreover, the internal enabling signal Int_Enable_I/O is asserted, the presence of a contact on the mixed pad by a testing machine or a host device having been detected. This is clearly a low cost implementation for the memory device.

2) using the enhanced ESD protection, the pad connection detection and the security access features (sequence recognition).

As previously, the tester presence detector circuit is used to provide a control signal PG having a high value so as to switch off the pull up open gate transistor Mpu, that receives such control signal PG on its gate terminal. In this case, however, the internal enabling signal Int_Enable_I/O is asserted only a right bit sequence is recognized.

Moreover, the enabling circuit having an enhanced ESD protection, pad connection detection and secure access, so ensuring the correct working of the memory device is to be provided only to the less numerous mixed pads and not to the highly more numerous high speed pads, resulting in a saving of silicon area.

In this way, it is easy to manage possible customer return, when the memory device has been already installed and then removed requiring further tests. In fact, it is possible to use the mixed pad also for data along the high speed paths, usually connected only to high speed pads for internal communications by "deviating" the same along the low speed path, usually reserved for testing the device at the manufacturing step, i.e. at a factory level. In this way, standard testing machine performing the testing of the device at a factory level may be used also to perform subsequent testing in some cases.

Suitably, using the sequence detection circuit of the TPD circuit, only permitted subsequent testing modes are allowed. In particular, after a first access to the memory at factory level, a more secure access mechanism is enabled so as to protect sensitive information being written into the memory device, such as uCode, voltage values or algorithms.

At each access the test machine can change the bit sequence with a new one to be used on the next access (to avoid replay attack).

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure.

Similar elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

The invention claimed is:

1. A memory device, comprising:
an array of memory cells;
mixed pads connected to the memory cells;
a three state multiplexer (MUX) block connected to the mixed pads;
electrostatic discharge (ESD) networks connected to the mixed pads; and
an enabling circuit connected to one of the mixed pads;
wherein the enabling circuit comprises:
 a tester presence detector circuit connected to the mixed pad, wherein the tester presence detector circuit comprises:
  a sequence detection circuit configured to:
   detect a bit sequence applied to the mixed pad to verify that a testing machine is an authorized one or that a testing mode is a correct one and grant a corresponding access to the memory cells from the mixed pad; and
   be enabled by writing an internal non-volatile flag; and
  a timer configured to be triggered when the testing machine contacts the mixed pad and configured to signal a possible time out that requires a restart of a testing procedure; and
 a logical gate having respective input terminals connected to the tester presence detector circuit.

2. The memory device of claim 1, wherein the memory device comprises a plurality of boundary cells configured to manage serial and parallel data.

3. The memory device of claim 2, wherein the memory device comprises high speed pads connected to the boundary cells through high speed paths.

4. The memory device of claim 1, wherein the three state MUX block is connected to the memory cells and is configured to receive thereto at least a first input signal and a second input signal.

5. The memory device of claim 1, wherein the mixed pads are connected to the memory cells through low speed paths.

6. The memory device of claim 1, wherein the mixed pads are configured to be contacted by probes of the testing machine.

7. The memory device of claim 1, wherein the enabling circuit is configured to receive an external enabling signal and to provide the three state MUX with an internal enabling signal.

8. The memory device of claim 1, wherein the respective input terminals of the logical gate are configured to receive an external enabling signal.

9. The memory device of claim 1, wherein the logical gate includes an output terminal configured to provide an internal enabling signal.

10. The memory device of claim 1, wherein the tester presence detector circuit is configured to provide a presence signal to the logical gate when the testing machine is connected to the mixed pad.

11. The memory device of claim 1, wherein the enabling circuit further comprises a pull up circuit connected to the mixed pad and to the tester presence detector circuit.

12. The memory device of claim 11, wherein the pull up circuit comprises a pull up open gate transistor inserted between a power voltage reference and the mixed pad and having a gate terminal connected to the tester presence detector circuit.

13. The memory device of claim 1, wherein the tester presence detector circuit is configured to receive from the mixed pad a test signal indicating that the testing machine is connected to the mixed pad.

14. The memory device of claim 1, wherein the sequence detection circuit comprises a finite state machine comprising a plurality of states connected according to stored bit sequences.

15. A System-on-Chip (SoC) component, comprising a memory device including:
an array of memory cells;
mixed pads connected to the memory cells;
a three state multiplexer (MUX) block connected to the mixed pads;
electrostatic discharge (ESD) networks connected to the mixed pads; and
an enabling circuit connected to one of the mixed pads;

wherein the enabling circuit comprises:
a tester presence detector circuit connected to the mixed pad, wherein the tester presence detector circuit comprises:
a sequence detection circuit configured to:
detect a bit sequence applied to the mixed pad to verify that a testing machine is an authorized one or that a testing mode is a correct one and grant a corresponding access to the memory cells from the mixed pad; and
be enabled by writing an internal non-volatile flag; and
a timer configured to be triggered when the testing machine contacts the mixed pad and configured to signal a possible time out that requires a restart of a testing procedure.

16. The SoC component of claim 15, wherein a latency of the SoC component is reduced by enabling a direct memory access to the memory cells when reading data.

17. The SoC component of claim 16, wherein the memory array is configured to receive a specific enabling signal in order to allow the direct memory access to the memory cells by connecting directly the memory cells to the three state MUX and to the mixed pad.

18. A method, comprising:
detecting a connection of a testing machine to a mixed pad of a memory device comprising an array of memory cells, the mixed pad being connected to an electrostatic discharge (ESD) Network; and
enabling, by an enabling circuit, generation of an internal enabling signal for a three state multiplexer (MUX) to provide the mixed pad with an input signal from the memory cells, wherein the enabling circuit comprises:
a tester presence detector circuit connected to the mixed pad, wherein the tester presence detector circuit comprises:
a sequence detection circuit configured to:
detect a bit sequence applied to the mixed pad to verify that a testing machine is an authorized one or that a testing mode is a correct one and grant a corresponding access to the memory cells from the mixed pad; and
be enabled by writing an internal non-volatile flag; and
a timer configured to be triggered when the testing machine contacts the mixed pad and configured to signal a possible time out that requires a restart of a testing procedure.

19. The method of claim 18, further comprising storing bit sequences of the mixed pad.

20. The method of claim 19, further comprising updating the stored bit sequences at the end of a testing procedure.

* * * * *